(12) United States Patent
Herner

(10) Patent No.: US 9,087,576 B1
(45) Date of Patent: Jul. 21, 2015

(54) LOW TEMPERATURE FABRICATION METHOD FOR A THREE-DIMENSIONAL MEMORY DEVICE AND STRUCTURE

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/434,567

(22) Filed: Mar. 29, 2012

(51) Int. Cl.
  *H01L 29/02* (2006.01)
  *G11C 13/00* (2006.01)
  *H01L 27/102* (2006.01)

(52) U.S. Cl.
  CPC ........ *G11C 13/0007* (2013.01); *H01L 27/1021* (2013.01)

(58) Field of Classification Search
  USPC ............................. 257/2, 4; 365/148; 438/381
  See application file for complete search history.

(56) References Cited

U.S. PATENT DOCUMENTS

| | | | |
|---|---|---|---|
| 680,652 | A | 8/1901 | Elden |
| 4,433,468 | A | 2/1984 | Kawamata |
| 4,684,972 | A | 8/1987 | Owen et al. |
| 4,741,601 | A | 5/1988 | Saito |
| 5,139,911 | A | 8/1992 | Yagi et al. |
| 5,242,855 | A | 9/1993 | Oguro |
| 5,278,085 | A | 1/1994 | Maddox, III et al. |
| 5,315,131 | A | 5/1994 | Kishimoto et al. |
| 5,335,219 | A | 8/1994 | Ovshinsky et al. |
| 5,360,981 | A | 11/1994 | Owen et al. |
| 5,457,649 | A | 10/1995 | Eichman et al. |
| 5,538,564 | A | 7/1996 | Kaschmitter |
| 5,541,869 | A | 7/1996 | Rose et al. |
| 5,594,363 | A | 1/1997 | Freeman et al. |
| 5,614,756 | A | 3/1997 | Forouhi et al. |
| 5,714,416 | A | 2/1998 | Eichman et al. |

(Continued)

FOREIGN PATENT DOCUMENTS

| | | |
|---|---|---|
| EP | 2405441 A1 | 1/2012 |
| EP | 2408035 A2 | 1/2012 |

(Continued)

OTHER PUBLICATIONS

Dongsoo Lee, Resistive Switching of Al doped ZnO for Non-Volatile Memory Applications, Gwangju Institute of Science and Technology, IEEE.*

(Continued)

*Primary Examiner* — David Vu
*Assistant Examiner* — Brandon Fox
(74) *Attorney, Agent, or Firm* — Amin, Turocy & Watson, LLP

(57) ABSTRACT

A non-volatile memory device structure. The device structure includes a first electrode, a second electrode and a state change material sandwiched between the first electrode and the second electrode. In a specific embodiment, the first electrode includes a p+ type polycrystalline silicon material or a p+ type silicon germanium material. The state change material includes an n– type zinc oxide material. The second electrode includes a doped zinc oxide material. The doped zinc oxide material can be $B_2O_3$:ZnO, $In_2O_3$:ZnO, $Al_2O_3$:ZnO or $Ga_2O_3$:ZnO. The n– type zinc oxide material and the p+ type silicon material (or p+ polycrystalline silicon germanium material) further form a diode device or steering device for the non-volatile memory device.

18 Claims, 12 Drawing Sheets

(56) References Cited

U.S. PATENT DOCUMENTS

| | | | |
|---|---|---|---|
| 5,751,012 A | 5/1998 | Wolstenholme et al. | |
| 5,840,608 A | 11/1998 | Chang | |
| 5,970,332 A | 10/1999 | Pruijmboom et al. | |
| 5,998,244 A | 12/1999 | Wolstenholme et al. | |
| 6,122,318 A | 9/2000 | Yamaguchi et al. | |
| 6,128,214 A | 10/2000 | Kuekes et al. | |
| 6,143,642 A | 11/2000 | Sur, Jr. et al. | |
| 6,180,998 B1 | 1/2001 | Crafts | |
| 6,259,116 B1 | 7/2001 | Shannon | |
| 6,291,836 B1 | 9/2001 | Kramer et al. | |
| 6,436,765 B1 | 8/2002 | Liou et al. | |
| 6,436,818 B1 | 8/2002 | Hu et al. | |
| 6,492,694 B2 | 12/2002 | Noble et al. | |
| 6,627,530 B2 | 9/2003 | Li et al. | |
| 6,762,474 B1 | 7/2004 | Mills, Jr. | |
| 6,768,157 B2 | 7/2004 | Krieger et al. | |
| 6,815,286 B2 | 11/2004 | Krieger et al. | |
| 6,838,720 B2 | 1/2005 | Krieger et al. | |
| 6,848,012 B2 | 1/2005 | LeBlanc et al. | |
| 6,858,481 B2 | 2/2005 | Krieger et al. | |
| 6,858,482 B2 | 2/2005 | Gilton | |
| 6,864,127 B2 | 3/2005 | Yamazaki et al. | |
| 6,864,522 B2 | 3/2005 | Krieger et al. | |
| 6,881,994 B2 | 4/2005 | Lee et al. | |
| 6,927,430 B2 | 8/2005 | Hsu | |
| 6,939,787 B2 | 9/2005 | Ohtake et al. | |
| 6,946,719 B2 | 9/2005 | Petti et al. | |
| 7,020,006 B2 | 3/2006 | Chevallier et al. | |
| 7,023,093 B2 | 4/2006 | Canaperi et al. | |
| 7,026,702 B2 | 4/2006 | Krieger et al. | |
| 7,102,150 B2 | 9/2006 | Harshfield et al. | |
| 7,122,853 B1 | 10/2006 | Gaun et al. | |
| 7,187,577 B1 | 3/2007 | Wang et al. | |
| 7,221,599 B1 | 5/2007 | Gaun et al. | |
| 7,238,607 B2 | 7/2007 | Dunton et al. | |
| 7,254,053 B2 | 8/2007 | Krieger et al. | |
| 7,289,353 B2 | 10/2007 | Spitzer et al. | |
| 7,324,363 B2 | 1/2008 | Kerns et al. | |
| 7,365,411 B2 | 4/2008 | Campbell | |
| 7,405,418 B2 | 7/2008 | Happ et al. | |
| 7,426,128 B2 | 9/2008 | Scheuerlein | |
| 7,433,253 B2 | 10/2008 | Gogl et al. | |
| 7,474,000 B2 | 1/2009 | Scheuerlein et al. | |
| 7,479,650 B2 | 1/2009 | Gilton | |
| 7,499,355 B2 * | 3/2009 | Scheuerlein et al. | 365/201 |
| 7,521,705 B2 | 4/2009 | Liu | |
| 7,534,625 B2 | 5/2009 | Karpov et al. | |
| 7,541,252 B2 | 6/2009 | Eun et al. | |
| 7,550,380 B2 | 6/2009 | Elkins et al. | |
| 7,606,059 B2 | 10/2009 | Toda | |
| 7,615,439 B1 | 11/2009 | Schricker et al. | |
| 7,629,198 B2 | 12/2009 | Kumar et al. | |
| 7,719,001 B2 * | 5/2010 | Nomura et al. | 257/40 |
| 7,728,318 B2 | 6/2010 | Raghuram et al. | |
| 7,729,158 B2 | 6/2010 | Toda et al. | |
| 7,749,805 B2 | 7/2010 | Pinnow et al. | |
| 7,772,581 B2 | 8/2010 | Lung | |
| 7,778,063 B2 | 8/2010 | Brubaker et al. | |
| 7,786,464 B2 | 8/2010 | Nirschl et al. | |
| 7,786,589 B2 | 8/2010 | Matsunaga et al. | |
| 7,824,956 B2 | 11/2010 | Schricker et al. | |
| 7,829,875 B2 | 11/2010 | Scheuerlein | |
| 7,835,170 B2 | 11/2010 | Bertin et al. | |
| 7,859,884 B2 | 12/2010 | Scheuerlein | |
| 7,875,871 B2 | 1/2011 | Kumar et al. | |
| 7,881,097 B2 | 2/2011 | Hosomi et al. | |
| 7,897,953 B2 | 3/2011 | Liu | |
| 7,898,838 B2 | 3/2011 | Chen et al. | |
| 7,920,412 B2 | 4/2011 | Hosotani et al. | |
| 7,924,138 B2 | 4/2011 | Kinoshita et al. | |
| 7,968,419 B2 | 6/2011 | Li et al. | |
| 7,972,897 B2 | 7/2011 | Kumar et al. | |
| 7,984,776 B2 | 7/2011 | Beyer et al. | |
| 8,004,882 B2 | 8/2011 | Katti et al. | |
| 8,018,760 B2 | 9/2011 | Muraoka et al. | |
| 8,021,897 B2 | 9/2011 | Sills et al. | |
| 8,045,364 B2 | 10/2011 | Schloss et al. | |
| 8,054,674 B2 | 11/2011 | Tamai et al. | |
| 8,067,815 B2 | 11/2011 | Chien et al. | |
| 8,071,972 B2 | 12/2011 | Lu et al. | |
| 8,084,830 B2 * | 12/2011 | Kanno et al. | 257/379 |
| 8,088,688 B1 | 1/2012 | Herner | |
| 8,097,874 B2 | 1/2012 | Venkatasamy et al. | |
| 8,102,698 B2 | 1/2012 | Scheuerlein | |
| 8,143,092 B2 | 3/2012 | Kumar et al. | |
| 8,144,498 B2 | 3/2012 | Kumar et al. | |
| 8,164,948 B2 | 4/2012 | Katti et al. | |
| 8,168,506 B2 | 5/2012 | Herner | |
| 8,183,553 B2 | 5/2012 | Phatak et al. | |
| 8,187,945 B2 | 5/2012 | Herner | |
| 8,198,144 B2 | 6/2012 | Herner | |
| 8,207,064 B2 | 6/2012 | Bandyopadhyay et al. | |
| 8,227,787 B2 | 7/2012 | Kumar et al. | |
| 8,231,998 B2 | 7/2012 | Albano et al. | |
| 8,233,308 B2 | 7/2012 | Schricker et al. | |
| 8,237,146 B2 | 8/2012 | Kreupl et al. | |
| 8,258,020 B2 | 9/2012 | Herner | |
| 8,265,136 B2 | 9/2012 | Hong et al. | |
| 8,274,812 B2 | 9/2012 | Jo et al. | |
| 8,315,079 B2 | 11/2012 | Kuo et al. | |
| 8,320,160 B2 | 11/2012 | Nazarian | |
| 8,374,018 B2 | 2/2013 | Lu | |
| 8,385,100 B2 | 2/2013 | Kau et al. | |
| 8,394,670 B2 | 3/2013 | Herner | |
| 8,441,835 B2 | 5/2013 | Jo et al. | |
| 8,467,227 B1 | 6/2013 | Jo | |
| 8,587,989 B2 | 11/2013 | Manning et al. | |
| 8,658,476 B1 | 2/2014 | Sun et al. | |
| 8,659,003 B2 | 2/2014 | Herner et al. | |
| 2003/0141565 A1 * | 7/2003 | Hirose et al. | 257/458 |
| 2003/0174574 A1 | 9/2003 | Perner et al. | |
| 2003/0206659 A1 | 11/2003 | Hamanaka | |
| 2004/0026682 A1 | 2/2004 | Jiang | |
| 2004/0170040 A1 | 9/2004 | Rinerson et al. | |
| 2005/0020510 A1 | 1/2005 | Benedict | |
| 2005/0029587 A1 | 2/2005 | Harshfield | |
| 2005/0041498 A1 | 2/2005 | Resta et al. | |
| 2005/0052915 A1 | 3/2005 | Herner et al. | |
| 2005/0062045 A1 | 3/2005 | Bhattacharyya | |
| 2005/0073881 A1 | 4/2005 | Tran et al. | |
| 2005/0175099 A1 | 8/2005 | Sarkijarvi et al. | |
| 2006/0017488 A1 | 1/2006 | Hsu | |
| 2006/0281244 A1 | 12/2006 | Ichige et al. | |
| 2007/0008773 A1 | 1/2007 | Scheuerlein | |
| 2007/0015348 A1 | 1/2007 | Hsu et al. | |
| 2007/0045615 A1 | 3/2007 | Cho et al. | |
| 2007/0087508 A1 | 4/2007 | Herner | |
| 2007/0090425 A1 | 4/2007 | Kumar et al. | |
| 2007/0091685 A1 | 4/2007 | Guterman et al. | |
| 2007/0105284 A1 | 5/2007 | Herner | |
| 2007/0105390 A1 | 5/2007 | Oh | |
| 2007/0205510 A1 | 9/2007 | Lavoie et al. | |
| 2007/0228414 A1 | 10/2007 | Kumar et al. | |
| 2007/0284575 A1 | 12/2007 | Li et al. | |
| 2007/0290186 A1 | 12/2007 | Bourim et al. | |
| 2007/0291527 A1 | 12/2007 | Tsushima et al. | |
| 2007/0295950 A1 | 12/2007 | Cho et al. | |
| 2007/0297501 A1 | 12/2007 | Hussain et al. | |
| 2008/0002481 A1 | 1/2008 | Gogl et al. | |
| 2008/0006907 A1 | 1/2008 | Lee et al. | |
| 2008/0048164 A1 | 2/2008 | Odagawa | |
| 2008/0089110 A1 | 4/2008 | Robinett et al. | |
| 2008/0090337 A1 | 4/2008 | Williams | |
| 2008/0106925 A1 | 5/2008 | Paz de Araujo et al. | |
| 2008/0106926 A1 | 5/2008 | Brubaker et al. | |
| 2008/0185567 A1 | 8/2008 | Kumar et al. | |
| 2008/0198934 A1 | 8/2008 | Hong et al. | |
| 2008/0205179 A1 | 8/2008 | Markert et al. | |
| 2008/0206931 A1 | 8/2008 | Breuil et al. | |
| 2008/0220601 A1 | 9/2008 | Kumar et al. | |
| 2008/0232160 A1 | 9/2008 | Gopalakrishnan | |
| 2008/0278990 A1 | 11/2008 | Kumar et al. | |
| 2008/0304312 A1 | 12/2008 | Ho et al. | |
| 2008/0311722 A1 | 12/2008 | Petti et al. | |

(56) References Cited

U.S. PATENT DOCUMENTS

| | | |
|---|---|---|
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1* | 6/2011 | Redaelli et al. ............... 365/163 |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0317470 A1 | 12/2011 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0269275 A1 | 10/2012 | Hannuksela |
| 2012/0305874 A1 | 12/2012 | Herner |
| 2012/0326263 A1* | 12/2012 | Yang et al. ............... 257/499 |
| 2012/0326265 A1* | 12/2012 | Lai et al. ............... 257/506 |
| 2013/0020548 A1 | 1/2013 | Clark et al. |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |

OTHER PUBLICATIONS

Dongsoo, Le. Resistive Switching of Al doped ZnO for Non-Volatile Memory Applications, Gwangju Institute of Science and Technology, IEEE.*

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

(56) References Cited

OTHER PUBLICATIONS

M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", 9th Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$ a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.

(56) References Cited

OTHER PUBLICATIONS

Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074 , dated Oct. 8, 2013.
Notice of Allowability for U.S. Appl. No. 13/452,657, dated Oct. 10, 2013.
Notice of Allowance for U.S. Appl. No. 13/174,264, dated Oct. 16, 2013.
Notice of Allowability for U.S. Appl. No. 13/417,135, dated Oct. 23, 2013.
Office Action of U.S. Appl. No. 13/436,714 dated Dec. 7, 2012.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 14/072,657, dated Jun. 17, 2014.

\* cited by examiner

LOW TEMPERATURE FABRICATION METHOD FOR A THREE-DIMENSIONAL MEMORY DEVICE AND STRUCTURE

BACKGROUND

The present invention is generally related to memory devices. More particularly, embodiments according to the present invention provide a method and a device structure to form a device structure that can be vertically stacked to increase device density. Embodiments according to the present invention can be applied to non-volatile memory devices but it should be recognized that the present invention can have a much broader range of applicability.

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

Embodiments according to the present invention are generally related to memory devices. More particularly, embodiments according to the present invention provide fabrication methods to form a state change device that can be vertically stacked, device structures to form a state change device that can be vertically stacked, devices having state change devices, and the like. In various embodiments, the present state change devices can be fabricated at a temperature no greater than about 450 Degree Celsius, compatible with a back end CMOS process. Embodiments according to the present invention can be applied to non-volatile memory devices but it should be recognized that the present invention can have a much broader range of applicability.

In a specific embodiment, a non-volatile memory device is provided. The non-volatile memory device includes a first wiring structure, a first p type semiconductor material overlying the first conductor structure and a first n type semiconductor material overlying the first p type semiconductor material. In a specific embodiment, the first n type semiconductor material has a state change characteristic. The non-volatile memory device includes a first steering device formed from the first p type semiconductor material and the first n type semiconductor material in a specific embodiment. The non-volatile memory device includes an active conductive material overlying the first n type semiconductor material and a first resistive switching device formed from the first active conductive material, the first n type semiconductor material and the first conductor structure. A second wiring structure overlies the active conductor material.

In a specific embodiment, a method of forming a non-volatile memory device is provided. The method includes providing a first wiring structure and forming a p type semiconductor material comprising a silicon bearing material overlying the first conductor structure. A resistive switching material having an n type semiconductor impurity characteristic is formed overlying the first p type semiconductor material. In a specific embodiment, the resistive switching material having the n type semiconductor impurity characteristic includes a metal oxide material. The method includes forming an n+ conductive material overlying the first resistive switching material having an n type semiconductor impurity characteristic. The method forms a p-n junction region and a first steering device from the p type semiconductor material and the resistive switching material having the n type semiconductor impurity characteristic. A first resistive switching device is formed from at least the first wiring structure, the resistive switching material having the n type semiconductor impurity characteristic, and the active conductive material. In a specific embodiment, the resistive switching device is serially coupled to the steering device. A second wiring structure is formed overlying the active conductive material.

In a specific embodiment, a non-volatile memory device structure is provided. The device structure includes a first wiring structure to connect the non-volatile memory device to a controlling circuitry. The device structure includes an active conductive material overlying the first wiring structure, a second wiring structure, and a state change material sandwiched between the active conductive material and the second wiring structure. In a specific embodiment, the active conductive material includes a first n− type semiconductor material. The first n type semiconductor material can include a doped zinc oxide material (for example, aluminum doped, indium doped, gallium doped, boron doped and others). The state change material can be a zinc oxide material in a specific embodiment. The zinc oxide material is characterized by an n− type impurity characteristic. The second wiring structure includes a first p type semiconductor material overlying the first n− type semiconductor material. The first p type semiconductor material includes a p+ type polycrystalline silicon material. The p+ type polycrystalline silicon material can be a p+ type polycrystalline silicon germanium material for a deposition temperature no greater than about 380 Degree Celsius. The first p type semiconductor material (for example, p+ polycrystalline silicon germanium material) and the first n type semiconductor material (for example ZnO) form a steering device (for example, a diode device) for the non-volatile memory device in a specific embodiment. The first active conductive material, the first n type semiconductor material and the second wiring structure form a first resistive switching device for the non-volatile memory device in a specific embodiment.

Embodiments according to the present invention provide a method and a device structure for a non-volatile memory device. The non-volatile memory device includes a resistive switching device for data storage coupled to a steering (current or voltage) device. Such a device configuration allows for vertical stacking and a high density device. Additionally, the device can be fabricated at a low temperature (no greater than about 450 Degree Celsius) within a thermal budget of a CMOS device. Depending on the embodiment, one or more of the benefits may be achieved. One skilled in the art would recognize other variations, modifications, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

Embodiments according to the present invention are generally related to memory devices. More particularly, embodiments according to the present invention provide a method and a device structure to form a state change device that can be vertically stacked to increase device density. Additionally, the present state change device can be fabricated at a temperature no greater than about 450 Degree Celsius, compatible with a back end CMOS process. Embodiments according to the present invention can be applied to non-volatile memory devices but it should be recognized that the present invention can have a much broader range of applicability.

Figure 1:
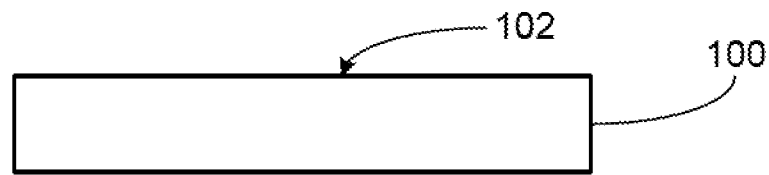
FIGS. 1-26 are simplified diagrams illustrating a method for forming a vertically stacked three dimensional memory device according to embodiments of the present invention.
Figure 2:
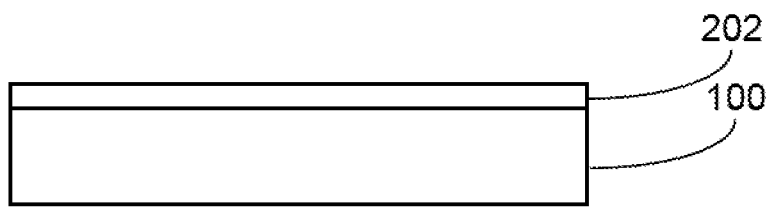

FIGS. 1-26 are simplified diagrams illustrating a method of forming a non-volatile memory device according to an embodiment of the present invention. As shown in FIG. 1, a substrate 100 having a surface region 102 is provided. The substrate can be a semiconductor such as single crystal silicon wafer, silicon on insulator (commonly known as SOI), or silicon germanium, and the like, depending on the embodiment. In a specific embodiment, the substrate can include one or more transistor device formed thereon. The one or more transistor device provide for controlling circuitry for the non-volatile memory device in a specific embodiment.

In certain embodiments, the semiconductor substrate can have one or more MOS devices formed thereon. The one or more MOS devices can be controlling circuitry for the state change devices in specific embodiments. In other embodiments, the one or more MOS devices may include other functionality, such as a processor, logic, or the like.

In various embodiments, a processor, or the like, may include state change memories as described herein. Because the state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

The method includes forming a first dielectric material 202 overlying the surface region of the substrate. The first dielectric material can be silicon oxide, silicon nitride, a dielectric stack of alternating layer of silicon oxide and silicon nitride (for example, an ONO stack), a low K dielectric, or a high K dielectric, depending on the embodiment. The first dielectric material can be formed using depositing method such as chemical vapor deposition (including plasma assisted, low pressure, atmospheric pressure, and others), physical vapor deposition, atomic layer deposition, spin on coating, including any combination of these, and others.

Figure 3:
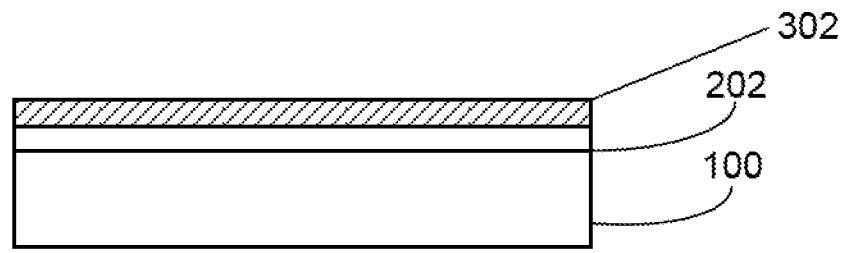

Referring now to FIG. 3. The method includes forming a first wiring material 302 overlying the first dielectric material. The first wiring material can include a metal material such as aluminum, tungsten, copper or a suitable doped semiconductor material, for example, doped polysilicon material, and others. The metal material can be formed using deposition method such as a physical vapor deposition process, chemical vapor deposition process, electrochemical method, for example, electroplating, or electroless deposition, including any combination of these, and others.

Figure 4:
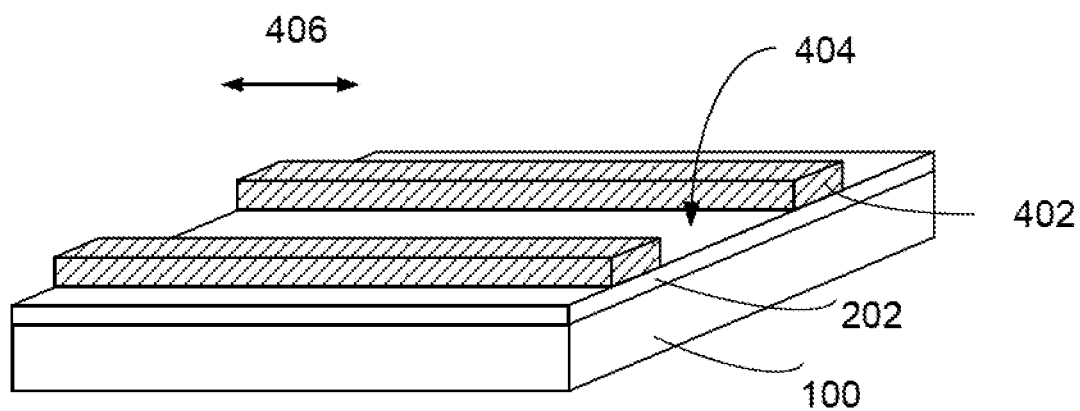

As illustrated in FIG. 4, the first wiring material is subjected to a first pattern and etch process to form one or more first wiring structure 402 and expose a portion of the first dielectric material 404. The one or more first wiring structure are elongated in shape and configured to extend in a first direction 406 in a specific embodiment.

Figure 5:
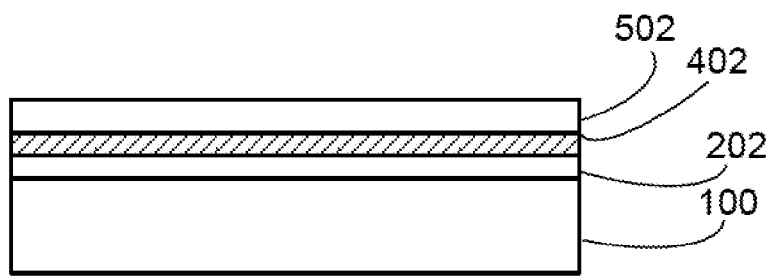
Figure 6:
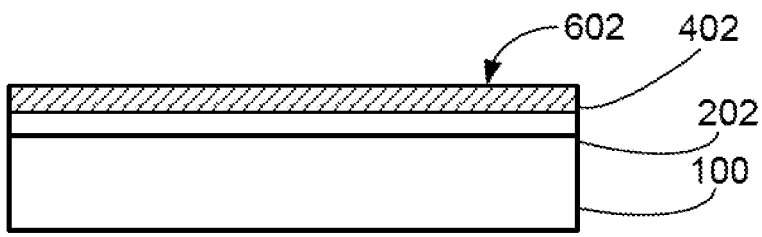

Referring to FIG. 5, the method includes depositing a second dielectric material 502 overlying the first wiring structure and filling a gap between the one or more first wiring structure. The method further subjects the second dielectric material to a first planarizing process to remove a portion of the second dielectric material and to expose a surface region 602 of the one or more first wiring structure and a surface region of the second dielectric material (not shown) as shown in FIG. 6. In a specific embodiment, the first planarizing process isolates the one or more first wiring structure in a specific embodiment.

Figure 7:
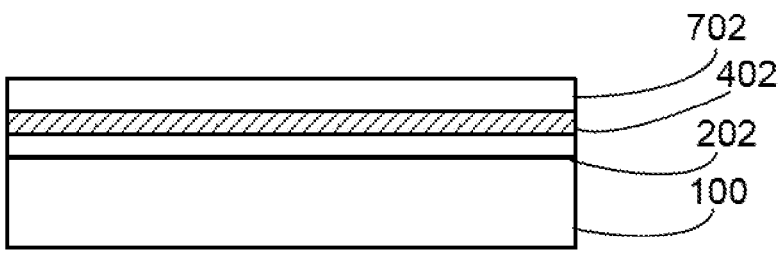

As shown in FIG. 7, the method includes forming a first p− type semiconductor material 702 overlying the surface region 602 of the first wiring structure and the first dielectric material, which are planarized. The first p− type semiconductor material can be a p− type silicon material, e.g. a p− type polysilicon material, p+ type polycrystalline silicon germanium material, or the like. In various embodiments, a p+ type polycrystalline silicon germanium (silicon germanium) material can be formed at a deposition temperature no greater than 450 Degree Celsius. Additionally the p+ type silicon germanium material can be doped using a suitable p− type impurity species and can have a crystalline characteristic as deposited at the deposition temperature.

In various embodiments, the p type silicon germanium material can be deposited using a low pressure chemical vapor deposition (LPCVD) process, a plasma enhanced or plasma assisted chemical vapor deposition (PECVD) process, atomic layer deposition (ALD) process. In a specific embodiment, silicon precursors such as silane ($SiH_4$), disilane ($Si_2H_6$), or chlorosilane ($SiH_xCl_{(4-x)}$) and germanium precursors such as germane ($GeH_4$) or germanium chloride ($GeCl_4$) may be used. In some embodiments, the p− type impurity species can be a boron species, an aluminum species, a gallium species, or an indium species, and others. The p type silicon germanium material may be deposited using a physical vapor deposition (PVD) process from a suitable target material, and others. In a specific embodiment, deposition temperature ranges from about 390 Degree Celsius to no greater than bout 450 Degree Celsius. In various embodiments, the p− type silicon germanium material is deposited using disilane, germane, and diborane (or boron chloride) as precursors at a deposition temperature of no greater than about 450 Degree Celsius. The as deposited p− type silicon germanium material has a polycrystalline characteristic and the dopant (for example, boron) is activated at the deposition temperature without further anneal.

Figure 8:
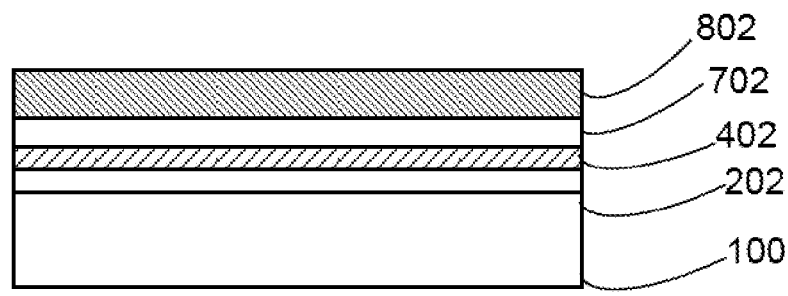

Referring to FIG. 8. A resistive switching material 802 is formed overlying the p− type semiconductor material (for example, the p− type silicon germanium material). The resistive switching material includes an n− type semiconductor material in a specific embodiment. In a specific embodiment, the n− type semiconductor material comprises a metal oxide. The n type metal oxide material and the p− type semiconductor material form a p-n junction region of a diode device for the non-volatile memory device in a specific embodiment.

In various embodiments, the n type metal oxide material can be a first zinc oxide material in a specific embodiment. The first zinc oxide material is not intentionally doped and has an n− impurity characteristic in a specific embodiment. Depending on the embodiment, the first zinc oxide material can be deposited using a physical vapor deposition process from a zinc oxide target material using a radio frequency energy source. Alternatively, the first zinc oxide material can be deposited using reactive DC magnetron from zinc target in an oxygen environment or other suitable oxygen source. Deposition temperature can range from room temperature (for example, at about 25 Degree Celsius) to less than about 100 Degree Celsius. Other suitable n type metal oxide materials may be used in other embodiments.

In various embodiments, n type metal oxide materials can include, for example, an indium oxide material, and others. In such embodiments, the indium oxide material may be doped using a tin oxide to change a conductivity characteristic of the indium oxide material. In another embodiment, the n type metal oxide material can include a tin oxide material. The tin oxide material may be doped using a fluorine, antimony, or the like, to change a conductivity characteristic of the tin oxide material in certain embodiments.

Figure 9:
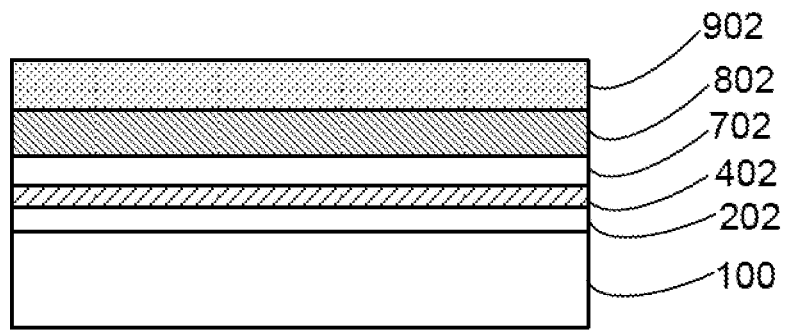
Figure 10:
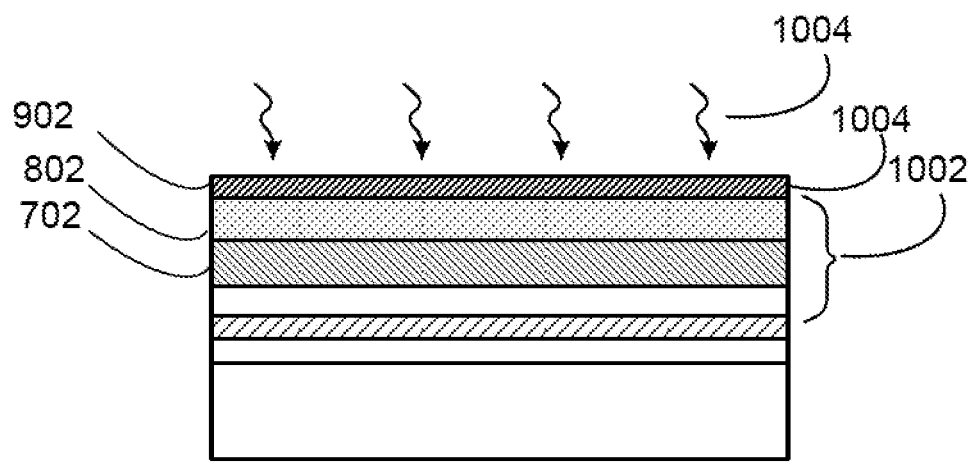

In some specific embodiments, the present method includes forming an active conductive material 902 overlying the resistive switching material (for example, the n− type zinc oxide material 802) as illustrated in FIG. 9. The active conductive material 902 can be a second zinc oxide material having an n++ impurity characteristic. Depending on the application, the n++ impurity characteristic may be provided using impurity species such as aluminum, gallium, or indium.

In various embodiments, the second zinc oxide material 902 having the n++ impurity characteristic may be formed using a physical vapor deposition process. For example, for aluminum doped zinc oxide (AZO) material, a suitable AZO target material may be used. Alternatively, the AZO material 802 and 902 may be formed by co-sputtering of an aluminum oxide target material and a zinc oxide target material whereby the aluminum concentration can be adjusted depending on the application. Deposition temperature can range from about room temperature (for example, 25 Degree Celsius) to about less than 100 Degree Celsius in a specific embodiment. In other embodiments, the active conductive material can be gallium oxide doped zinc oxide material ($Ga_2O_3$:ZnO); boron oxide doped zinc oxide material ($B_2O_3$:ZnO); indium oxide doped zinc oxide material ($In_2O_3$:ZnO), or a combination thereof.

In a specific embodiment, a "hard mask" conductor material 1004 such as Ti, TiN, TiW, W, WN, or combinations thereof can be deposited on top of the n++ material 902. Other suitable hard mask material may also be used depending on the application.

Figure 11:
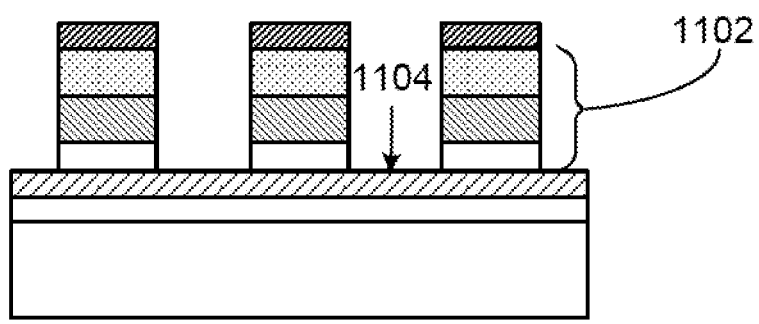

In a specific embodiment, the methods subjects a stack of material 1002 including the p type semiconductor material 702, the n− type metal oxide material 802, and the active conductive material 902, to a second pattern and etch process using hard mask 1004 as a masking layer. The second pattern and etch process forms one or more first structures 1102 comprising the p type semiconductor material 702, the n− type metal oxide material 802, and the active conductive material 902 in a specific embodiment. The second pattern and etch process further exposes a surface portion 1104 of the first wiring structure in a specific embodiment, One or more first structures 1102 are isolated structures in physical and electric contact with the first wiring structure 402 in a specific embodiment, as shown in FIG. 11.

Figure 12:
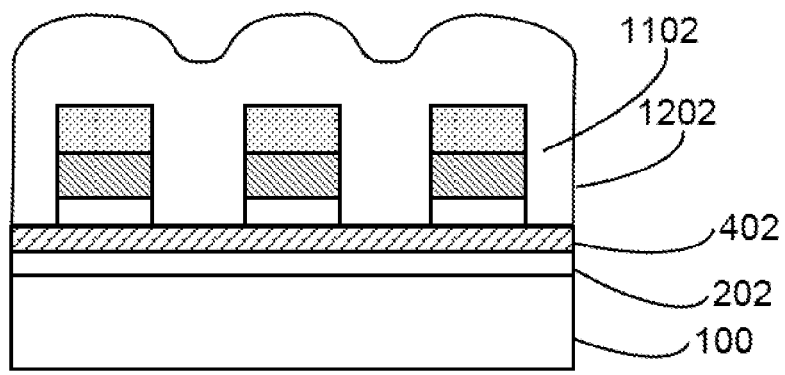

Referring to FIG. 12, the method includes forming a third dielectric material 1202 overlying the one or more first structures and the exposed surface portion of the first wiring structure. The third dielectric material can be silicon oxide, silicon nitride, a dielectric stack of alternating layer of silicon oxide and silicon nitride (for example, an ONO stack), a low K dielectric, or a high K dielectric, depending on the embodiment. The third dielectric material 1202 can be formed using deposition method such as chemical vapor deposition (including plasma assisted, low pressure, atmospheric pressure, and others), physical vapor deposition, atomic layer deposition, spin on coating, including any combination of these, and others.

Figure 13:
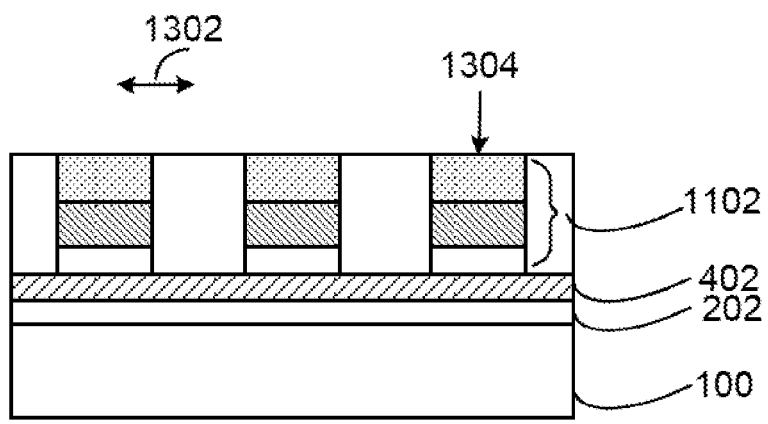

Next, as illustrated in FIG. 13, the third dielectric material 1202 is subjected to a second planarizing process 1302 to expose a top surface 1304 of the first structure 1102 and to isolate each of the one or more first structures in a specific embodiment.

Figure 14:
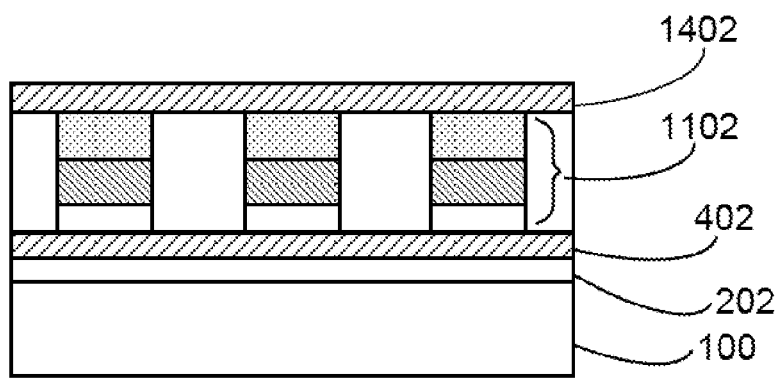

The method forms a second wiring material 1402 overlying the exposed top surface 1304 of the first structure and the planarized surface of the third dielectric material as illustrated in FIG. 14. Second wiring material 1402 can include a metal material such as copper, aluminum, tungsten, and others. The metal material can be formed using deposition method such as a physical vapor deposition process, chemical vapor deposition process, electrochemical method, for example, electroplating, or electroless deposition, including any combination of these, and others.

Figure 15:
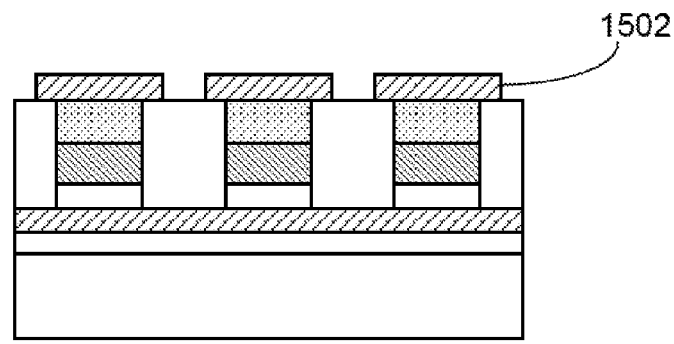
Figure 16:
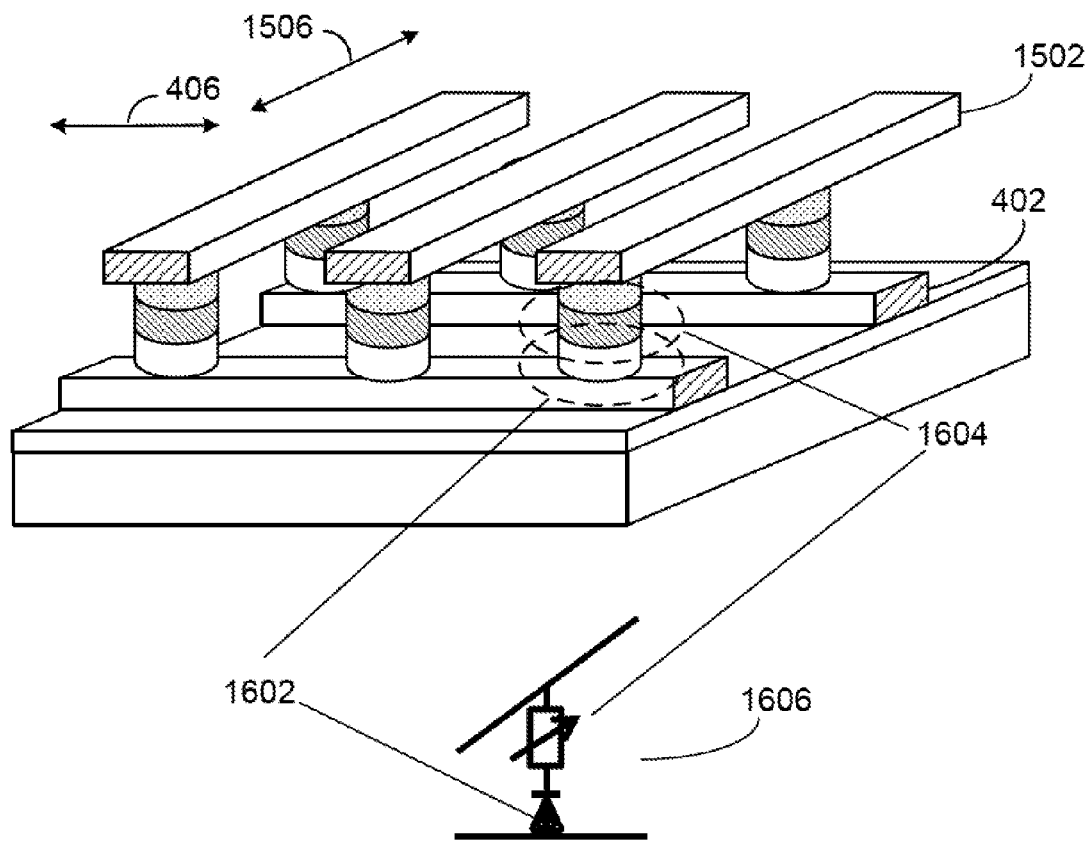

The second wiring material 1402 is subjected to a third pattern and etch process to form one or more second wiring structures 1502 and expose a portion of the third dielectric material 1202, as shown in FIG. 15. The one or more second wiring structures are elongated in shape and configured to extend in a second direction 1506 in a specific embodiment. The second direction 1506 is configured at an angle to the first direction 406. In a specific embodiment, the second direction 1506 is configured to be orthogonal to the first direction 406 in certain embodiments. Each of the one or more first structure is configured in an intersection region of the first wiring structure 402 and the second wiring structure 1502. Each of the first structures comprises a resistive switching device 1604 and a steering device 1602 in a specific embodiment. A perspective view is illustrated in FIG. 16.

In various embodiments, the p− type silicon germanium material and the n type zinc oxide material form a diode device or steering device 1602. The n type zinc oxide material further forms the resistive switching material for a resistive switching device 1604. In a specific embodiment, the resistive switching device 1604 includes the aluminum doped zinc oxide material (AZO), zinc oxide material and the first wiring material in a specific embodiment.

The above sequence of steps provides a method of forming a first layer 1606 of resistive switching device according to an embodiment of the present invention. Each of the memory devices in the first layer is serially coupled to a respective diode device for rectification in a specific embodiment.

Figure 17:
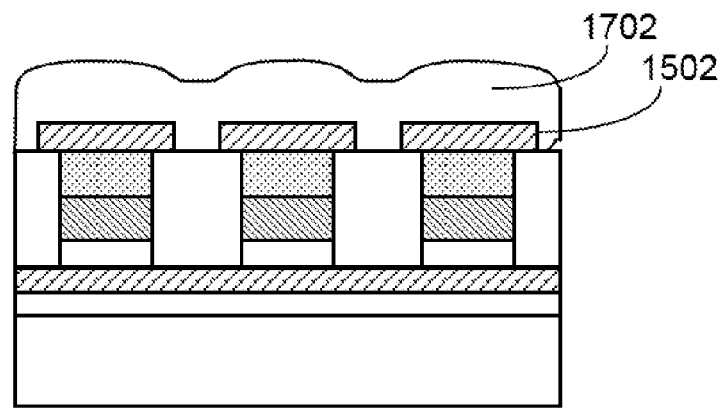

Referring to FIG. 17, in various embodiments, the method forms a fourth dielectric material 1702 is formed overlying the second wiring structure 1502 to isolate the second wiring structures. Fourth dielectric material 1702 can be silicon oxide, silicon nitride, a dielectric stack of alternating layer of silicon oxide and silicon nitride (for example, an ONO stack), a low K dielectric, or a high K dielectric, depending on the embodiment. Fourth dielectric material 1702 can be formed using a deposition method such as chemical vapor deposition (including plasma assisted, high density plasma, low pressure, atmospheric pressure, and others), physical vapor deposition, atomic layer deposition, spin on coating, including any combination of these, and others.

Figure 18:
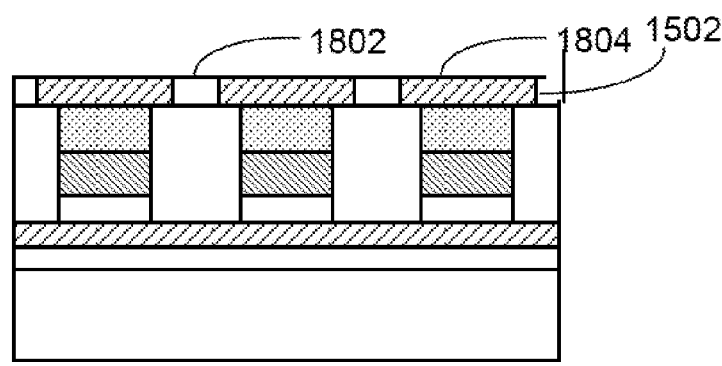
Figure 19:
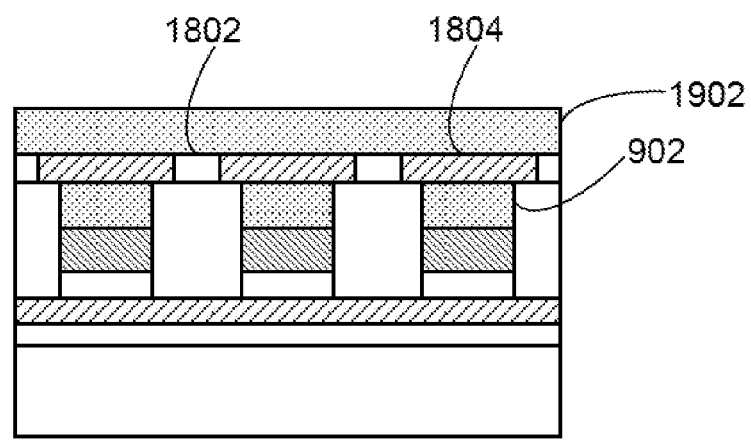

As shown in FIG. 18, fourth dielectric material 1702 is subjected to a third planarizing process to form a planarized surface 1802 and to expose a top surface region 1804 of the second wiring structure 1502 and to isolate each of the second wiring structures 1502.

In various embodiments a second active conductive material 1902 is formed overlying exposed top surface region 1802 of the second wiring structures and planarized surface 1804 of the third dielectric material in a specific embodiment. Second active conductive material 1902 can be the same as the active conductive material 902 and can be deposited using a same process in a specific embodiment. As merely an example, the second active conductive material 1902 can be aluminum doped zinc oxide material having an n++ impurity characteristic. In other embodiments, the second active conductive material 1902 may be different from the (first) active conductive material 902.

Figure 20:
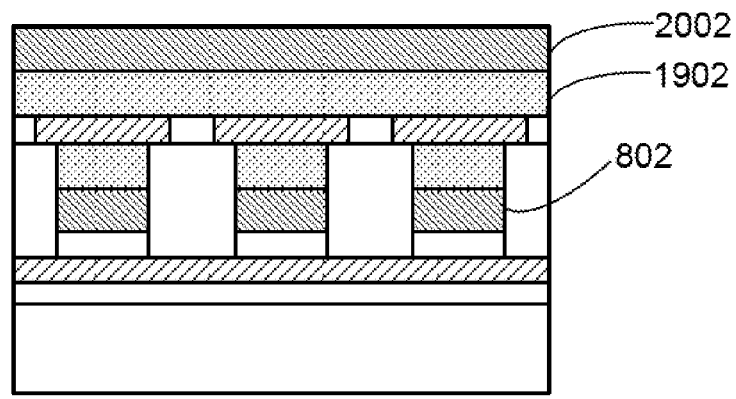
Figure 21:
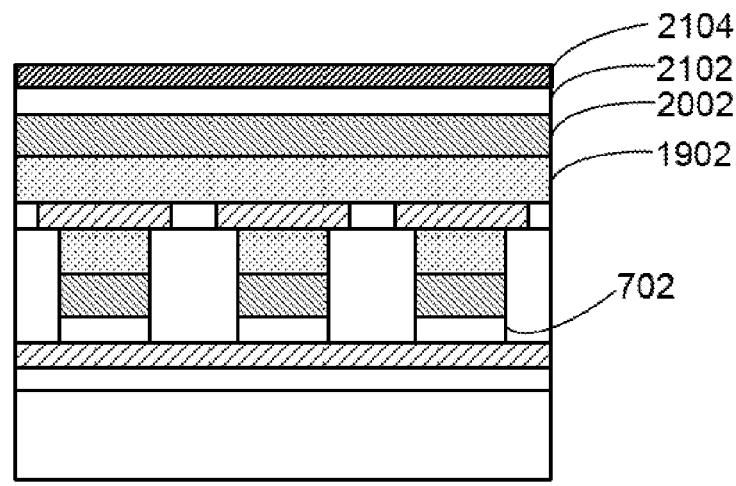

Referring now to FIG. 20. The method includes depositing a second resistive switching material 2002 overlying the active conductive material. Second resistive switching material 2002 can be a zinc oxide material having an n− impurity characteristic in a specific embodiment. Other suitable resistive switching material may also be used. In some embodiments, second resistive switching material 2002 may be formed using the same techniques described in conjunction with resistive switching material 802. A second p type semiconductor material 2102 is then deposited overlying the second resistive switching material as shown in FIG. 21. Second p type semiconductor material 2102 can be a p type silicon material in a specific embodiment. In a specific embodiment, Second p type semiconductor material 2102 can be a polycrystalline silicon germanium material having a p+ type impurity semiconductor material characteristic. In various embodiments, semiconductor material 2102 may be formed using the same techniques described for first p− type semiconductor material 702, above.

Figure 27:
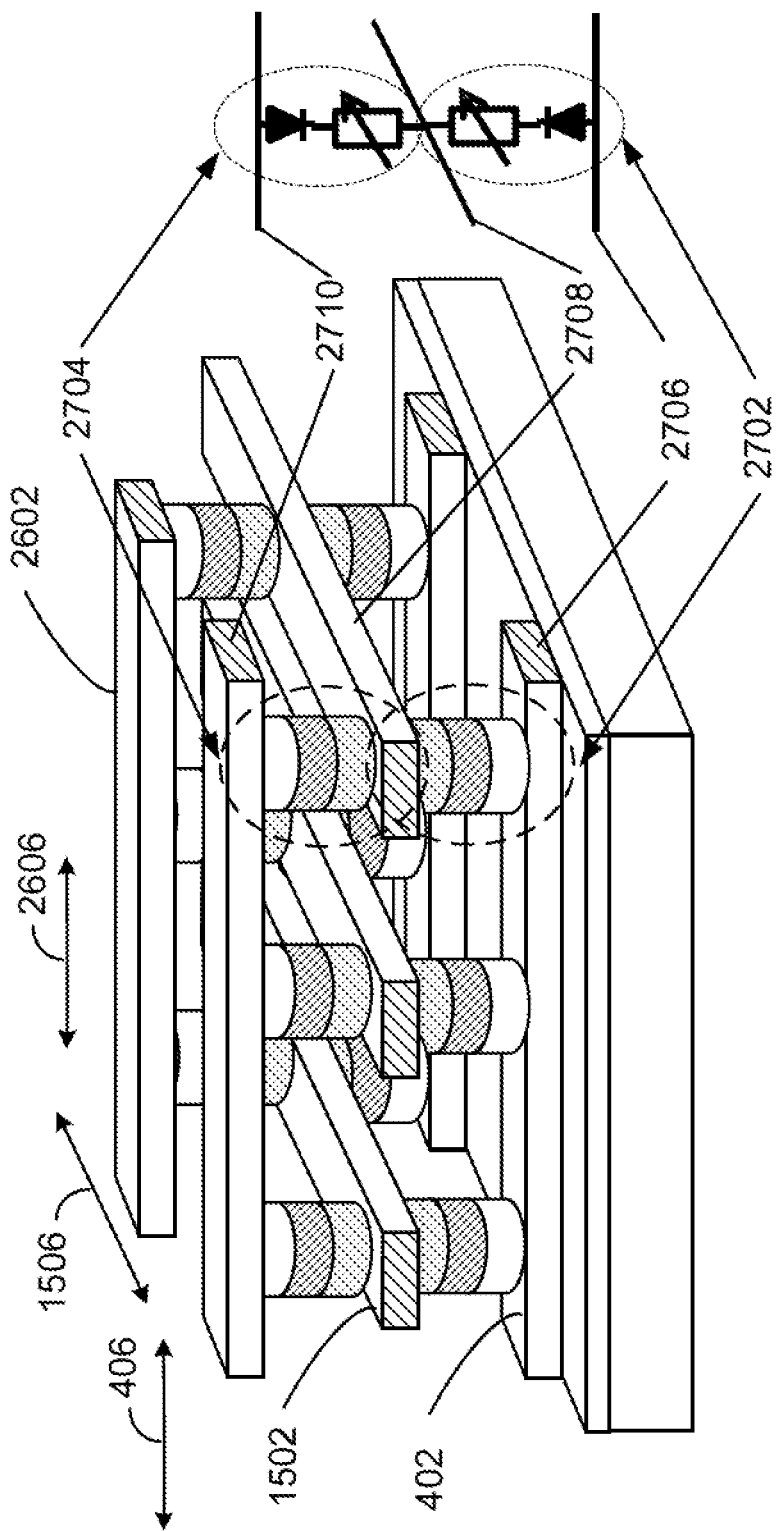
FIG. 27 is a simplified perspective diagram illustrating a vertically stacked three dimensional memory device according to an embodiment of the present invention.

In various embodiments, second p type semiconductor material 2102 and second n− type resistive switching material 2002 form a p-n junction region for a second diode device to provide for rectification for the second memory device in a specific embodiment. This is illustrated in FIG. 27.

In a specific embodiment, a "hard mask" conductive material 2104, such as Ti, TiN, TiW, W, WN, or combinations thereof, are deposited overlying of second p type semiconductor material 2102. In other embodiments, other suitable hard mask material may also be used depending on the application.

Figure 22:
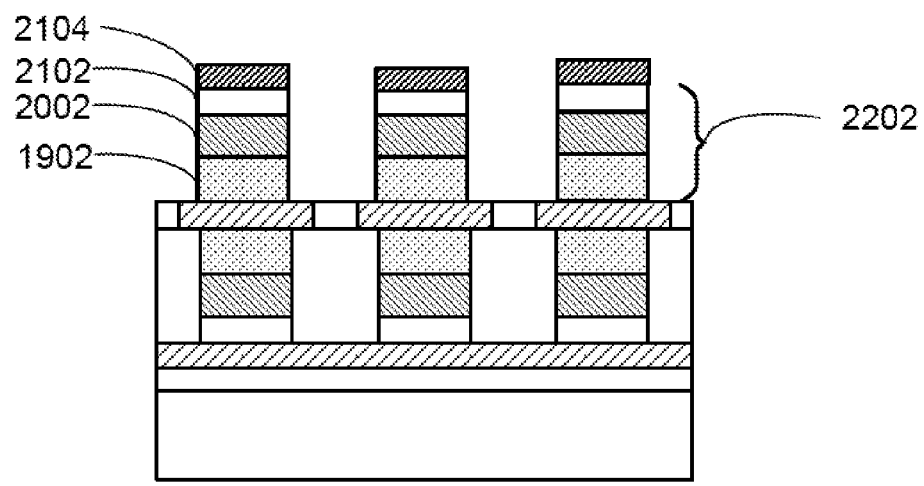

As shown in FIG. 22, in various methods, the method subjects a second stack of material comprising the second p type semiconductor material 2102, the second n− type resistive switching material 2002, and the second active conductive material 1902 to a pattern and etch process to form one or more second structures 2202. Functionally, second structure 2202 comprises a second diode device formed from the p+ semiconductor material 2102 and the n− type resistive switching material 2002. In a specific embodiment, the second structure includes a second resistive switching device formed from the active conductive material, the n− type resistive switching material, and the second wiring structure. The resistive switching device and the second diode device are serially connected, as shown in FIG. 27.

In a specific embodiment, the second p− type silicon germanium material 2102 and the second n type zinc oxide material 2002 form a second diode device or a second steering device. The second n type zinc oxide material further forms the second resistive switching material for a second resistive switching device. In a specific embodiment, the second resistive switching device includes the second aluminum doped zinc oxide material (AZO), the second zinc oxide material and the second wiring material in a specific embodiment. In other embodiments, the second zinc oxide material can be gallium oxide doped zinc oxide material ($Ga_2O_3$:ZnO) or boron oxide doped zinc oxide material ($B_2O_3$:ZnO) or indium oxide doped zinc oxide material ($In_2O_3$:ZnO), or a combination thereof.

Figure 23:
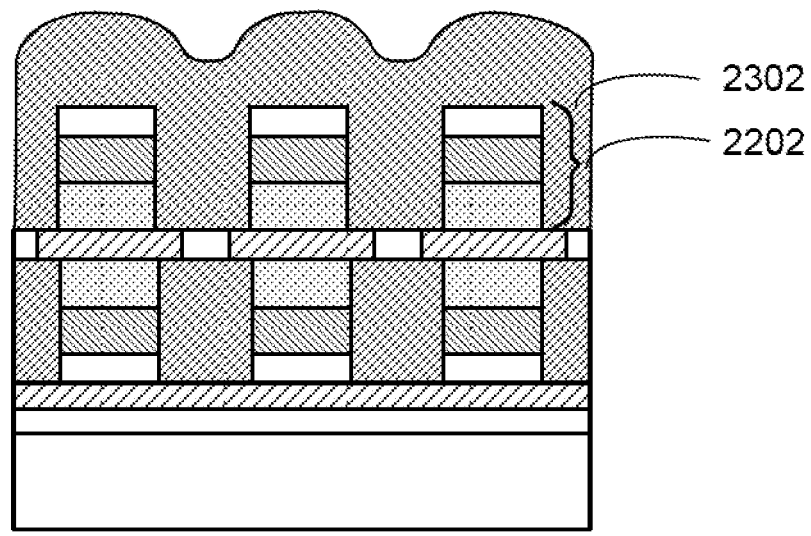

In some embodiments, the method forms a fifth dielectric material 2302 overlying the one or more second structure 2202 and fills a gap between the one or more second structures as shown in FIG. 23. Fifth dielectric material 2302 can be can be silicon oxide, silicon nitride, a dielectric stack of alternating layer of silicon oxide and silicon nitride (for example, an ONO stack), a low K dielectric, or a high K dielectric, and others, depending on the embodiment. The fifth dielectric material 2302 can be formed using depositing method such as chemical vapor deposition (including plasma assisted, high density plasma, low pressure, atmospheric pressure, and others), physical vapor deposition, atomic layer deposition, spin on coating, including any combination of these, and others.

Figure 24:
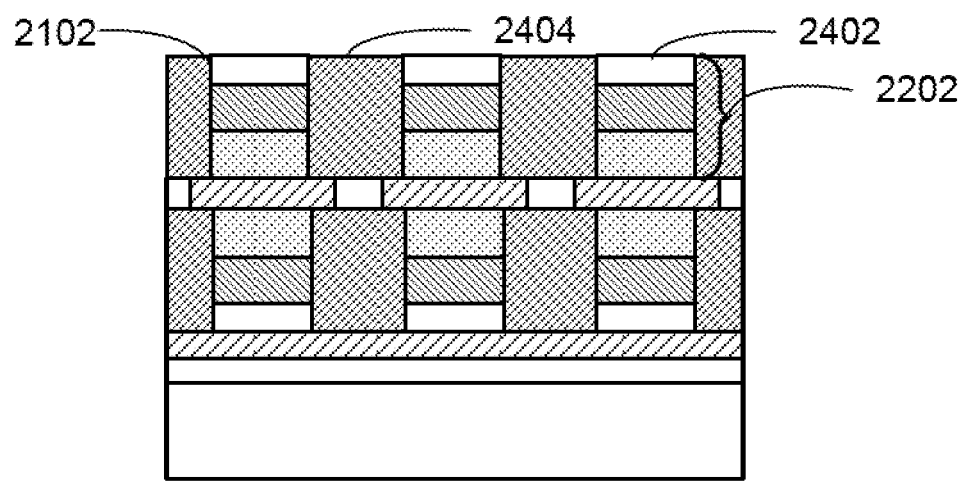

Referring now to FIG. 24, in various embodiments, the method subjects the fifth dielectric material 2302 to a planarizing process to expose a top surface region 2402 of the one or more second structure 2202 and to expose a surface region 2404 of the fifth dielectric material 2302, to isolate each of the one or more second structures 2202. Top surface region 2402 of each of the one or more second structure includes a surface region of the p+ silicon material 2102, (for example, the p+ silicon germanium material) in a specific embodiment.

Figure 25:
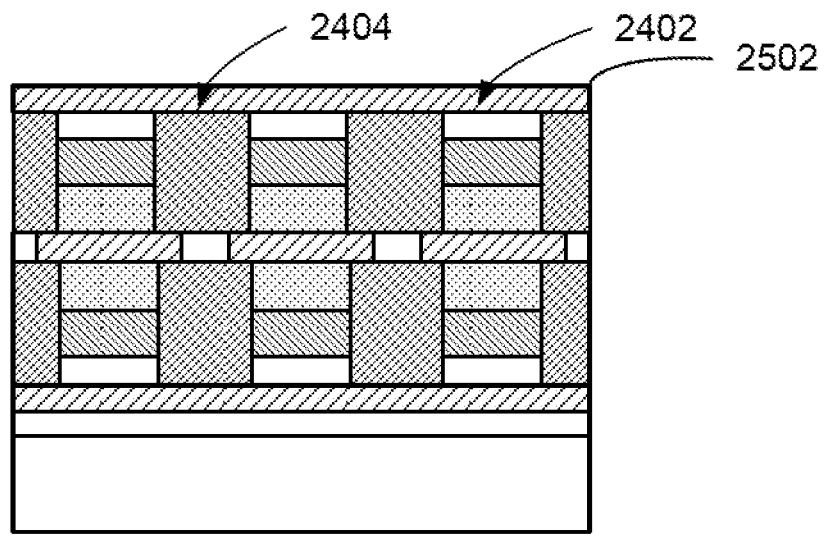

A third wiring material 2502 is formed overlying top surface region of the one or more second structures 2402 and planarized surface of the firth dielectric material 2404 as shown in FIG. 25. Third wiring material 2502 can include a metal material such as aluminum, tungsten, copper or a suitable doped semiconductor material, for example, doped polysilicon material, and others. The metal material can be formed using deposition method such as a physical vapor deposition process, chemical vapor deposition process, electrochemical method, for example, electroplating, or electroless deposition, including any combination of these, and others. In various embodiments, the third wiring material 2502 may be formed using the same techniques as wiring material 1502 and/or 402.

Figure 26:
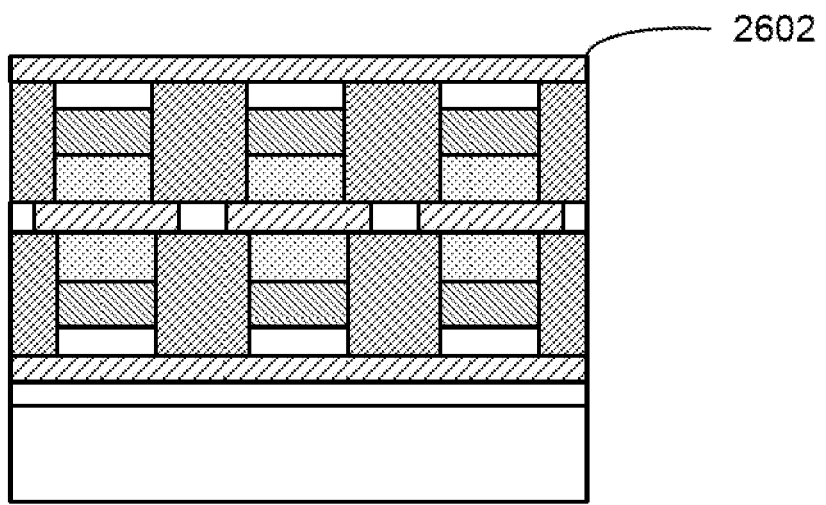

Third wiring material 2502 is subjected to a pattern an etch process to form one or more third wiring structure 2602 and expose a portion of the fifth dielectric material 2604, as shown in FIG. 26. The one or more third wiring structures 2602 are elongated in shape and configured to extend in a direction 2606 in a specific embodiment. In various embodiments direction 2606 may be the same direction as direction 406 and orthogonal to direction 1506. In other embodiments, these directions need not be parallel or orthogonal.

Referring to FIG. 27, a perspective view of a memory device comprising two layers of resistive switching device is illustrated according to various embodiments of the present invention. A simplified circuit is also shown. As shown, each of the resistive switching devices is serially connected to a diode device to provide rectification in a specific embodiment. In various embodiments, the memory device is vertically stacked to provide for a high density device structure. Taking memory device 2702 and memory device 2704 as an example. Memory device 2702 includes a first bottom electrode 2706, a first top electrode 2708, a first resistive switching device and a first diode device. Memory device 2704 is vertically stacked on the memory device 2702 and shares a common electrode 2708 with memory device 2702. First top electrode 2708 serves as a bottom electrode for memory device 2704. Memory device 2704 includes a second diode device and a second resistive switching device. As shown, the first diode device associated with memory device 2702 allows current to flow from the first bottom electrode to the first top electrode. The second diode device associated with memory device 2704 allows current to flow through the second resistive switching device from the second top electrode to the first top electrode. Such arrangement of the first diode device and the second diode device allows for electrode 2708 to be shared between memory device 2702 and memory device 2704. Additionally, as described, each of the memory device 2702 and memory device uses an n type semiconductor material (for example, zinc oxide material) for the resistive switching material for the resistive switching device and each of the diode device further simplify the process steps and fabrication cost.

Depending on the embodiment, the present method can be further extended to N layers of vertically stacked memory devices, where N is an integer ranging from 1 to 8, or greater. As each of the memory devices includes a steering element, the N layers of vertically stacked can share a common electrode as illustrated in FIG. 27.

Figure 28:
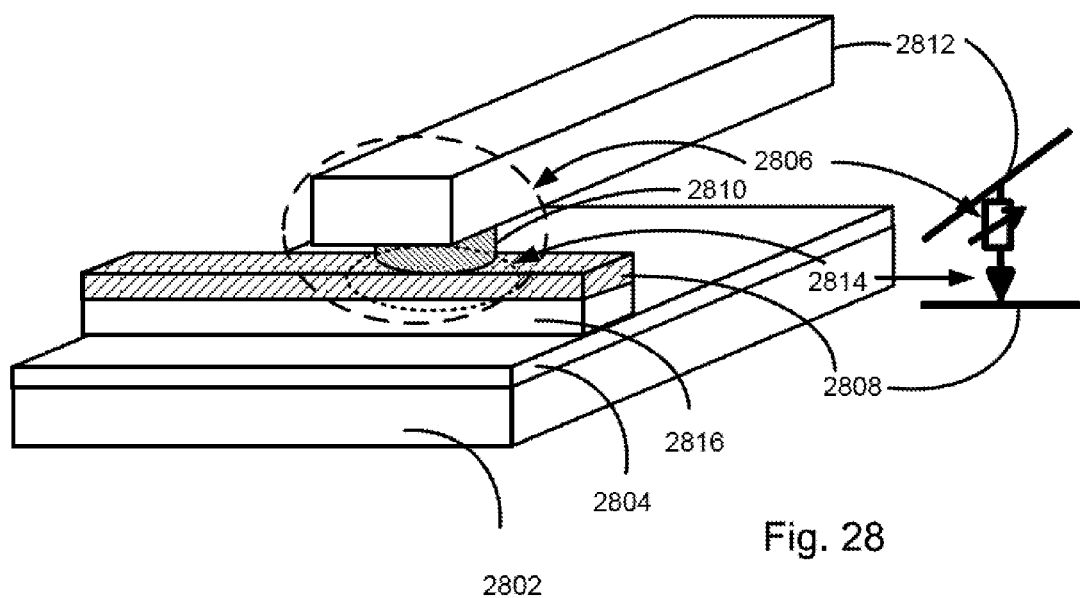
FIGS. 28-28a are simplified perspective diagrams illustrating a resistive switching device according to an alternative embodiment of the present invention.

Other variations may also be implemented as illustrated in FIG. 28. A perspective view of a device structure 2800 and a corresponding simplified circuit 2820 are shown. As shown, a substrate 2802 having a surface region is provided. A dielectric material 2804 is formed overlying the substrate. A memory device 2806 is formed overlying dielectric material 2804. Memory device 2806 includes a bottom electrode 2808, a resistive switching material 2810, and a top electrode 2812. In this embodiment, bottom electrode 2808 includes an n+ aluminum doped zinc oxide material, resistive switching material 2810 includes a n− zinc oxide material, and top electrode 2812 includes a p+ polycrystalline silicon material (for example, a p+ silicon germanium material.) In this implementation, p+ polycrystalline silicon material and n− aluminum doped zinc oxide material further form a diode device 2814 for the memory device.

Referring again to FIG. 28, depending on the embodiment, a bottom wiring structure 2816 may be provided to connect memory device 2806 to external control circuitry. The bottom wiring structure can be a suitable metal material used in CMOS interconnects. The metal material can include copper, tungsten, aluminum, or silver depending on the implementation. The bottom wiring structure can further include one or more diffusion barrier material or adhesion material to improve material and device performance.

Figure 28A:
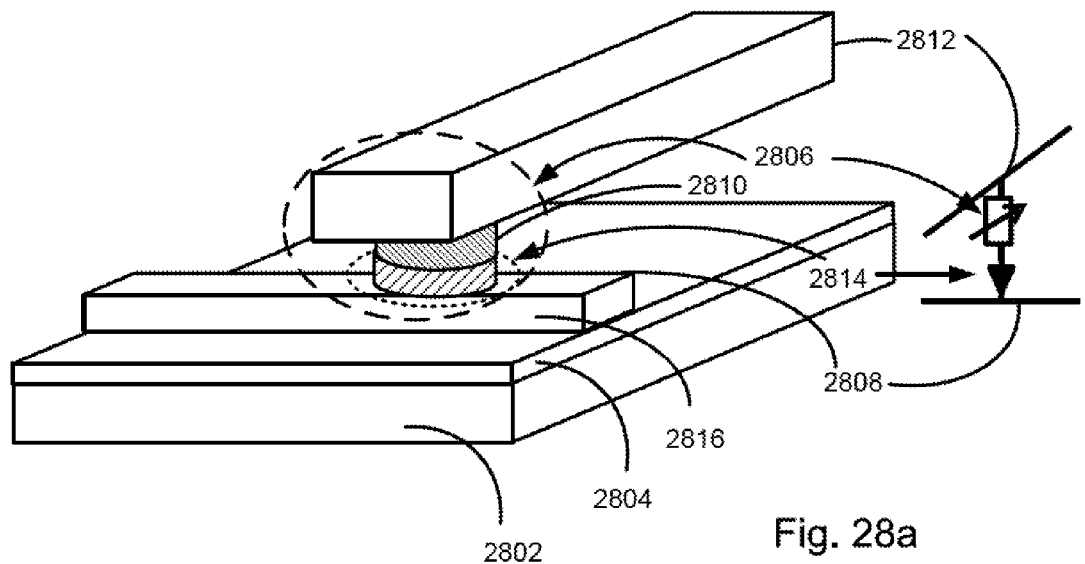

Depending on the embodiment, there can be other implementations. For example, bottom electrode 2808 and resistive switching material 2810 can form an isolated, "pillar-type" structure as shown in FIG. 28A. In such an embodiment, top electrode 2812 and bottom wiring structure 2816 connect the memory device to external controlling circuitry and configured to be perpendicular to each other.

Figure 29:
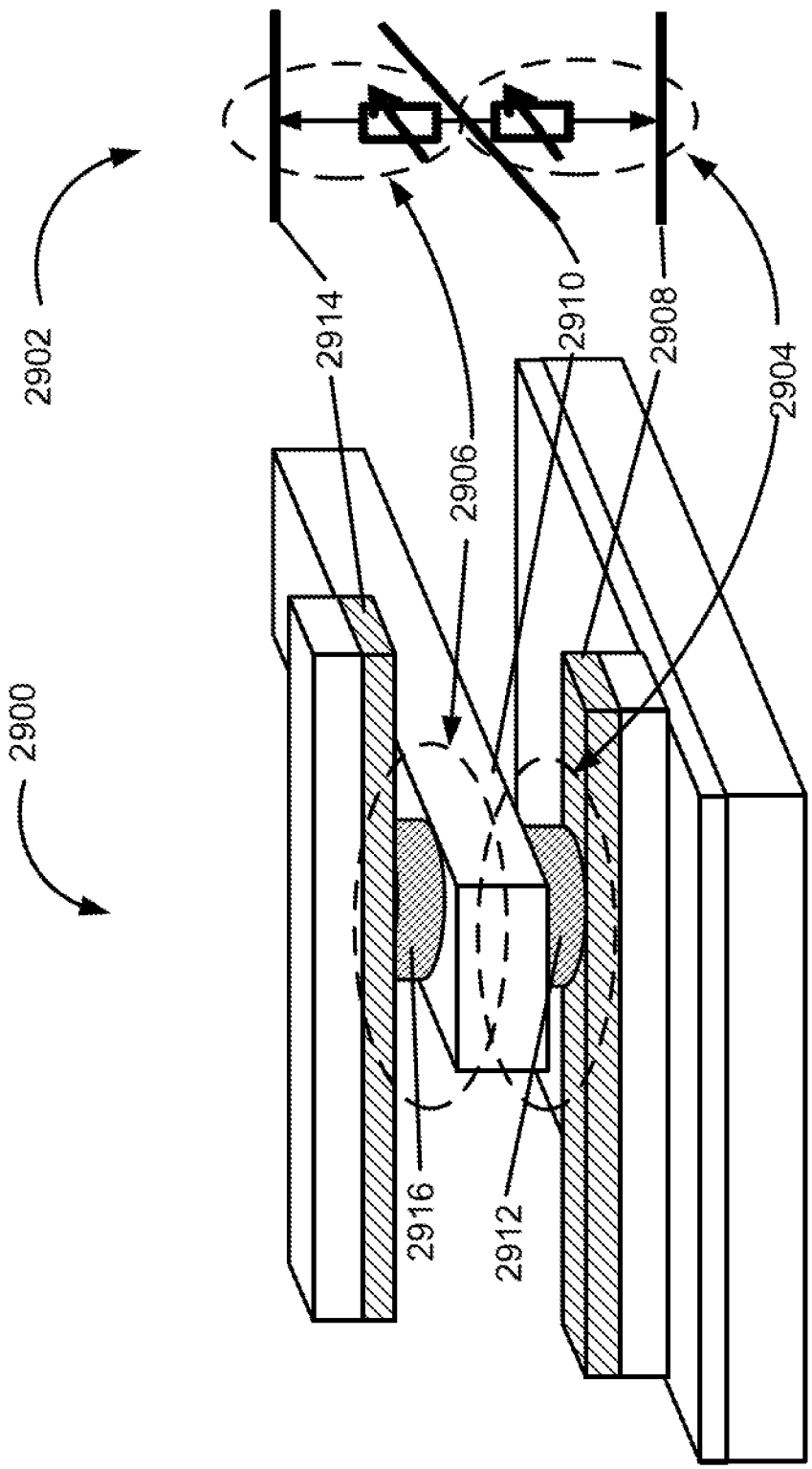
FIG. 29 is a simplified perspective diagram illustrating a vertically stacked three dimensional memory device according to the alternative embodiment of the present invention.

Again, device structures in FIGS. 28 and 28A can be vertical extended. As illustrated in FIG. 29 a two layer memory device 2900 using device structure in FIG. 28 is provided. A corresponding simplified circuit diagram 2902 is also show. As shown, memory device 2900 includes a first resistive switching device 2904 and a second resistive switching device 2906 vertically integrated to provide for a high density memory device. First resistive switching device 2704 includes a first bottom electrode 2908, a first top electrode 2910, and a first resistive switching material 2912 formed between first bottom electrode 2908 and first top electrode 2910. Second resistive switching device 2906 includes a second bottom electrode, which is common with first top electrode 2910 for first resistive switching device 2704, a second top electrode 2914, and a second resistive switching material 2916 formed between second bottom electrode 2908 and second top electrode 2914. In this embodiment, first bottom electrode 2908 and second top electrode each include an aluminum doped zinc oxide material having a n+ semiconductor characteristic. Common first top electrode and second bottom electrode 2910 includes a p+ polycrystalline silicon material (for example a p+ polycrystalline silicon germanium material for low deposition temperature). First resistive switching material 2912 and second resistive switching material 2916 each includes a zinc oxide material.

Referring again to FIG. 29. First resistive switching device 2904 further includes a first diode device 2918 formed from the first top electrode 2910 and first switching material 2912, allowing current to flows from the first top electrode to the first bottom electrode. Second resistive switching device 2906 further includes a second diode device 2920 formed from the second bottom electrode 2910 and second switching material 2916, allowing current to flows from the second bottom electrode2910 to the second top electrode 2914. As the first diode device and the second diode device are each configured to direct current in an opposite direction, disturbance during programming or erasing or reading can be reduced or substantially eliminated. Moreover, since the resistive switching material (n− zinc oxide material) is discrete and isolated for each resistive switching device, parasitic device is less likely to form between laterally neighboring devices.

In one embodiment, a non-volatile memory device structure comprises:
a first wiring structure;
an active conductive material overlying the first wiring structure;
a state change material comprising a first n− type semiconductor material overlying the first wiring structure;
a second wiring structure comprising a first p type semiconductor material overlying the first n− type semiconductor material;
a steering device formed from the first p type semiconductor material and the first n type semiconductor material; and
A first resistive switching device formed from the first active conductive material, the first n type semiconductor material and the second wiring structure.

In some embodiments, the first active conductive material is selected from the group consisting of: boron doped zinc oxide material ($B_2O_3$:ZnO), an indium doped zinc oxide ($In_2O_3$:ZnO), an aluminum doped zinc oxide material ($Al_2O_3$:ZnO), and a gallium doped zinc oxide ($Ga_2O_3$:ZnO) material.

In some embodiments, the first wiring material is selected from the group consisting of: aluminum, copper, tungsten, and silver.

In some embodiments, the first n− type semiconductor material comprises a zinc oxide (ZnO) material.

In some embodiments, the first p type semiconductor material comprises a p+ polycrystalline silicon material or a p+ polycrystalline silicon germanium material.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A non-volatile memory device structure comprising:
a first wiring structure;
a first p type semiconductor material overlying the first wiring structure;
a first n− type state change semiconductor material overlying the first p type semiconductor material, the first n− type state change semiconductor material having a resistance change characteristic, wherein the first n− type state change semiconductor material comprises a zinc oxide;
a first steering device formed from the first p type semiconductor material and the first n− type state change semiconductor material;
a first n+ type active conductive material overlying the first n− type state change semiconductor material, wherein the n+ type active conductive material comprises an aluminum doped zinc oxide material;
a first resistive switching device formed from the first n+ type active conductive material, the first n− type state change semiconductor material and the first wiring structure; and
a second wiring structure overlying the first n+ type active conductor material.

2. The device of claim 1 wherein the first p type semiconductor material and the first n− type state change semiconductor material form a steering device serially and operably coupled to the resistive switching device.

3. The device of claim 1 wherein the first p− type semiconductor material is selected from a group consisting of: a p+ polycrystalline silicon germanium material, a p+ type polycrystalline silicon material, and a p+ type single crystal silicon material.

4. The device of claim 1 wherein the first n− type state change semiconductor material is characterized by an electrical resistance modulated by an electric field in the first n− type state change semiconductor material.

5. The device of claim 1 further comprises:
a second n+ type active conductive material overlying the second wiring structure, wherein the second n+ type active conductive material comprises an aluminum doped zinc oxide material;
a second n− type state change semiconductor material overlying the second n+ type active conductive material, the second n− type state change semiconductor material having a state change characteristic, wherein the second n− type state change semiconductor material comprises a zinc oxide;
a second p type semiconductor material overlying the second n− type state change semiconductor material;
a second steering device formed from the second n− type state change semiconductor material and the second p type semiconductor material;
a third wiring structure overlying the second p type semiconductor material; and
a second resistive switching device formed from at least the second n+ type active conductive material, the second n− type state change semiconductor material, and the third wiring material.

6. The device of claim 5 wherein the second n+ type active conductor material is selected from a group consisting of: aluminum doped zinc oxide material (AZO), gallium oxide material, gallium oxide doped zinc oxide material (Ga2O3:ZnO), boron oxide doped zinc oxide material (B2O3:ZnO), indium oxide doped zinc oxide material (In2O3:ZnO), or a combination thereof.

7. The device of claim 5 wherein the second n− type state change semiconductor material is selected from a group consisting of: zinc oxide material, zinc oxide material that is not deliberately doped, indium oxide material, indium oxide doped with tin oxide.

8. The device of claim 5 wherein the first n− type state change semiconductor material comprises tin oxide, where the tin oxide is doped with fluorine or antimony.

9. The device of claim 5 wherein the second p type semiconductor material comprises a p+ type polycrystalline silicon germanium material.

10. A method of forming a non-volatile memory device, comprising:
providing a first wiring structure;
forming a p type semiconductor material comprising a silicon bearing material overlying the first wiring structure;
forming a first resistive switching material having an n− type state change semiconductor impurity characteristic overlying the first p type semiconductor material, the resistive switching material comprising a zinc oxide material;
forming an n+ conductive material overlying the first resistive switching material having an n+ type state change semiconductor impurity characteristic, wherein the n+ conductive material comprises an aluminum doped zinc oxide material;

forming a p-n junction region and a first steering device from the p type semiconductor material and the first resistive switching material having the n– type state change semiconductor impurity characteristic;

forming a first resistive switching device from at least the first wiring structure, the first resistive switching material having the n– type state change semiconductor impurity characteristic, and the n+ conductive material, the resistive switching device being serially coupled to the steering device; and forming a second wiring structure overlying the n+ conductive material.

11. The method of claim 10 wherein the silicon bearing material is selected from a group consisting of: p+ polysilicon material, a p+ single crystal material, a p+ polycrystalline silicon germanium material.

12. The method of claim 11 wherein forming the p type semiconductor material comprises forming a p+ silicon germanium material by a chemical vapor deposition process using disilane (Si2H6), germane (GeH4) and diborane (B2H6) as precursors, or by a chemical vapor deposition process using disilane (Si2H6), germane (GeH4) and boron chloride (BC16) as precursors.

13. The method of claim 10 wherein forming the first resistive switching device and forming the steering device further comprises forming a pillar structure from at least the n+ conductive material, the first resistive switching material having an n– type state change semiconductor impurity characteristic, and the p type semiconductor material.

14. The method of claim 10 wherein the first resistive switching material is selected from a group consisting of: a zinc oxide material, a zinc oxide material that is not intentionally doped.

15. The method of claim 10 wherein the aluminum doped zinc oxide material is formed by a physical vapor deposition process using a DC magnetron at a deposition temperature ranging from about 25 Degree Celsius to no greater than about 100 Degree Celsius.

16. The method of claim 14 wherein the zinc oxide material is characterized by a resistance that has been modified by a transient electric field.

17. The method of claim 14 wherein the zinc oxide material is deposited using a method selected from a group consisting of:

a physical vapor deposition process using radio frequency as an energy source from a zinc oxide target material at a deposition temperature ranging from about 25 Degree Celsius to no greater than about 100 Degree Celsius, a physical vapor deposition process form a zinc target material in an oxygen environment, a chemical vapor deposition process, deposited using a liquid precursor, and deposited using an atomic layer deposition (ALD) process.

18. The method of claim 10 further comprises:

forming a second n+ conductive material overlying the second wiring structure;

forming a second resistive switching material having an n– type state change semiconductor impurity characteristic overlying the second n+ conductive material;

forming a second p type semiconductor material comprising a silicon bearing material overlying the second resistive switching material;

forming a third wiring structure overlying the p type semiconductor material comprising a silicon bearing material;

forming a second p-n junction region and a second steering device from the second resistive switching material having an n– type state change semiconductor impurity characteristic and the second p type semiconductor material;

forming a second resistive switching device from at least the third wiring structure, the second resistive switching material having the n– type state change semiconductor impurity characteristic, and the second n+ conductive material, the second resistive switching device being serially coupled to the second steering device.

* * * * *